United States Patent
Thomas et al.

(10) Patent No.: US 7,494,272 B2
(45) Date of Patent: Feb. 24, 2009

(54) DYNAMIC SURFACE ANNEALING USING ADDRESSABLE LASER ARRAY WITH PYROMETRY FEEDBACK

(75) Inventors: Timothy N. Thomas, Portland, OR (US); Dean Jennings, Beverly, MA (US); Bruce E. Adams, Portland, OR (US); Abhilash J. Mayur, Salinas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 281 days.

(21) Appl. No.: 11/469,684

(22) Filed: Sep. 1, 2006

(65) Prior Publication Data

US 2008/0121626 A1 May 29, 2008

Related U.S. Application Data

(60) Provisional application No. 60/817,131, filed on Jun. 27, 2006.

(51) Int. Cl.
*G01N 3/28* (2006.01)
*G01J 5/08* (2006.01)
*H01L 21/477* (2006.01)

(52) U.S. Cl. .......................... 374/53; 374/130; 374/167; 374/E17.002; 374/E7.002; 438/663; 219/121.83; 219/121.76; 356/47; 372/50.122

(58) Field of Classification Search ................. 374/53, 374/121, 124, 126, 130, 137, 160, 166, 167; 374/E17.002, E7.002; 438/660–664; 219/121.83; 219/121.76; 356/47; 372/50.12, 50.122
See application file for complete search history.

(56) References Cited

U.S. PATENT DOCUMENTS

| | | | | |
|---|---|---|---|---|
| 4,328,516 A | * | 5/1982 | Colpack et al. | 348/166 |
| 6,419,387 B1 | * | 7/2002 | Legrandjacques et al. | 374/5 |
| 6,728,275 B2 | | 4/2004 | Stephens, IV et al. | 372/36 |
| 6,987,240 B2 | | 1/2006 | Jennings et al. | 219/121.8 |
| 7,015,422 B2 | * | 3/2006 | Timans | 219/390 |
| 2003/0052105 A1 | * | 3/2003 | Nagano et al. | 219/121.83 |
| 2004/0018008 A1 | * | 1/2004 | Koren et al. | 392/416 |
| 2004/0198028 A1 | * | 10/2004 | Tanaka et al. | 438/487 |
| 2006/0102607 A1 | | 5/2006 | Adams et al. | 219/121.83 |

* cited by examiner

*Primary Examiner*—Edward Lefkowitz
*Assistant Examiner*—Bret Adams
(74) *Attorney, Agent, or Firm*—Law Office of Robert M. Wallace

(57) ABSTRACT

Apparatus for dynamic surface annealing of a semiconductor wafer includes a source of laser radiation emitting at a laser wavelength and comprising an array of lasers arranged in rows and columns, the optical power of each the laser being individual adjustable and optics for focusing the radiation from the array of lasers into a narrow line beam in a workpiece plane corresponding to a workpiece surface, whereby the optics images respective columns of the laser array onto respective sections of the narrow line beam. A pyrometer sensor is provided that is sensitive to a pyrometer wavelength. An optical element in an optical path of the optics is tuned to divert radiation emanating from the workpiece plane to the pyrometry sensor. As a result, the optics images each of the respective section of the narrow line beam onto a corresponding portion of the pyrometer sensor. The apparatus further includes a controller responsive to the pyrometry sensor and coupled to adjust individual optical outputs of respective columns of the laser array in accordance with outputs of corresponding portions of the pyrometry sensor.

12 Claims, 9 Drawing Sheets

DYNAMIC SURFACE ANNEALING USING ADDRESSABLE LASER ARRAY WITH PYROMETRY FEEDBACK

CROSS-REFERENCE TO RELATED APPLICATIONS

This application claims the benefit of U.S. Provisional Application Ser. No. 60/817,131, filed Jun. 27, 2006.

FIELD OF THE INVENTION

The invention relates generally to thermal processing of semiconductor substrates. In particular, the invention relates to laser thermal processing of semiconductor substrates.

BACKGROUND OF THE INVENTION

Thermal processing is required in the fabrication of silicon and other semiconductor integrated circuits formed in silicon wafers or other substrates such as glass panels for displays. The required temperatures may range from relatively low temperatures of less than 250° C. to greater than 1000° C. or 1300° C., for example, and may be used for a variety of processes such as dopant implant annealing, crystallization, oxidation, nitridation, silicidation, and chemical vapor deposition as well as others.

For the very shallow circuit features required for advanced integrated circuits, it is greatly desired to reduce the total thermal budget in achieving the required thermal processing. The thermal budget may be considered as the total time at high temperatures necessary to achieve the desired processing temperature. The time that the wafer needs to stay at the highest temperature can be very short.

Rapid thermal processing (RTP) uses radiant lamps. Such lamps have an on/off switching time of at least a half second and therefore cannot avoid heating the entire bulk of the wafer. As a result, the anneal time must be limited to avoid exceeding the thermal budget. Pulsed laser annealing using very short (about 20 ns) laser pulses is effective at heating only the surface layer and not the underlying wafer, thus allowing very short ramp up and ramp down rates.

A more recently developed approach in various forms, sometimes called thermal flux laser annealing or dynamic surface annealing (DSA), is described in U.S. Pat. No. 6,987,240, issued Jan. 17, 2006 by Jennings et al. and incorporated herein by reference in its entirety. This DSA apparatus uses CW diode lasers to produce very intense beams of light that strike the wafer as a thin long line of radiation. The line is then scanned over the surface of the wafer in a direction perpendicular to the long dimension of the line beam.

In DSA processing, temperature measurement is desirable because the amount of light coupled into the wafer strongly depends upon the surface structure already formed in the wafer. Furthermore, light source conditions may vary somewhat. Wide-angle pyrometers are generally used in RTP apparatus to monitor large portions of the wafer. Such pyrometers are generally inappropriate for the focused laser beams of DSA apparatus the irradiate only a small area of the wafer at any time, leaving the bulk of the wafer near ambient temperature.

In DSA processing, there is a need to compensate for absorption and reflectivity variations across the semiconductor substrate surface and variation in output of the laser array across the thin line of radiation. For example, variation in reflectivity and absorption of thermal energy at the semiconductor device level for devices which are comprised of features that have varying absorption and reflectivity of said thermal radiation. Such features are many micrometers to submicrometers in dimension.

SUMMARY OF THE INVENTION

Apparatus for dynamic surface annealing of a semiconductor wafer includes a source of laser radiation emitting at a laser wavelength and comprising an array of lasers arranged in rows and columns, the optical power of each the laser being individual adjustable and optics for focusing the radiation from the array of lasers into a narrow line beam in a workpiece plane corresponding to a workpiece surface, whereby the optics images respective columns of the laser array onto respective sections of the narrow line beam. A pyrometer sensor is provided that is sensitive to a pyrometer wavelength. An optical element in an optical path of the optics is tuned to divert radiation emanating from the workpiece plane to the pyrometry sensor. As a result, the optics images each of the respective section of the narrow line beam onto a corresponding portion of the pyrometer sensor. The apparatus further includes a controller responsive to the pyrometry sensor and coupled to adjust individual optical outputs of respective columns of the laser array in accordance with outputs of corresponding portions of the pyrometry sensor.

DETAILED DESCRIPTION OF THE INVENTION

Introduction:

A DSA processing apparatus employs an imaging pyrometer, an imaging emissometer, and computer addressable laser diode array to compensate for absorption and reflectivity variations across the wafer. The addressable laser diode array energy is focused onto the semiconductor substrate surface for the purposes of DSA thermal processing. As the substrate is heated, the imaging emissometer and pyrometer measure the emmissivity and determine the temperature variation across the line beam image zone on semiconductor substrate surface produced by the addressable laser diode array through the focusing optics. The addressable laser diode array is intensity corrected by a programmed controller to compensate for variations detected by the emissometer and pyrometer. Essentially, a line of laser light is focused onto the semiconductor surface and individual zones or image elements along the laser line are temperature controlled by controlling the electrical current to like zones (e.g., columns of laser emitters) within the addressable laser diode array. In this manner the invention is able to compensate for variations in reflectivity and emmissivity on the semiconductor substrate surface and for variations in radiance of the laser array.

Figure 1:
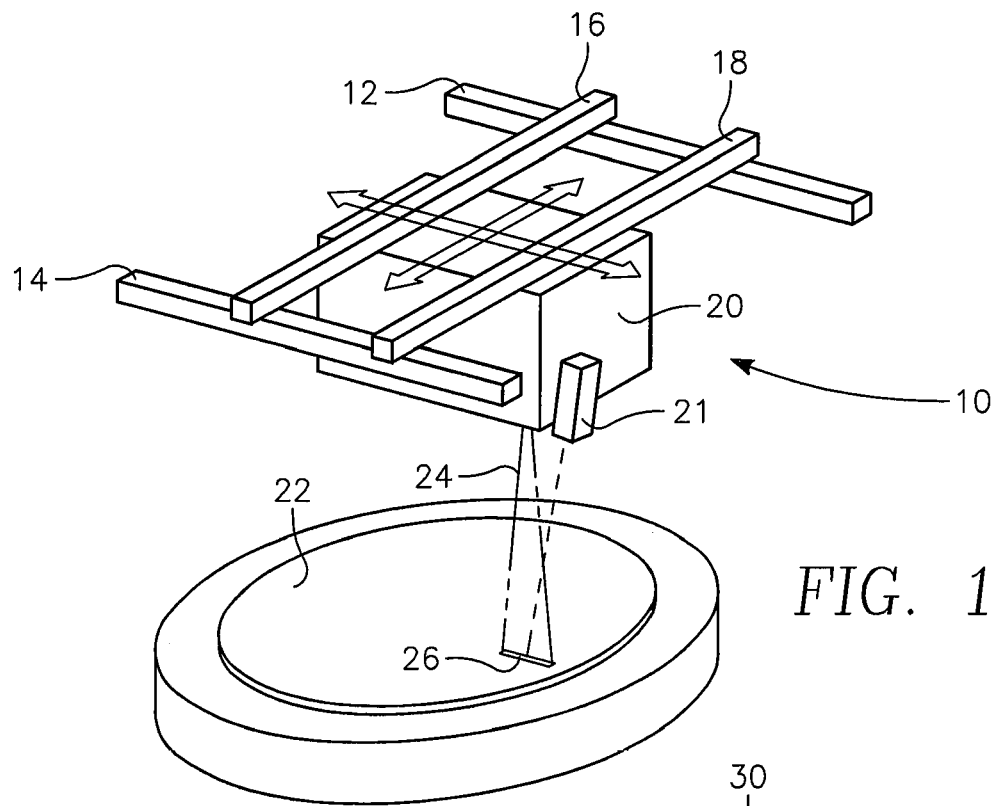
FIG. 1 is an orthographic representation of a thermal flux laser annealing apparatus employed in the present invention.

Dynamic Surface Annealing:

One embodiment of the DSA apparatus described in the above-referenced application by Jennings et al. is illustrated in the schematic orthographic representation of FIG. 1. A gantry structure 10 for two-dimensional scanning includes a pair of fixed parallel rails 12, 14. Two parallel gantry beams 16, 18 are fixed together a set distance apart and supported on the fixed rails 12, 14 and are controlled by an unillustrated motor and drive mechanism to slide on rollers or ball bearings together along the fixed rails 12, 14. A light beam source 20 is slidably supported on the gantry beams 16, 18, and may be suspended below the beams 16, 18 which are controlled by unillustrated motors and drive mechanisms to slide along them. A silicon wafer 22 or other substrate is stationarily supported below the gantry structure 10. The beam source 20 includes a laser light source and optics to produce a downwardly directed fan-shaped beam 24 that strikes the wafer 22 as a line beam 26 extending generally parallel to the fixed rails 12, 14, in what is conveniently called the slow direction. Although not illustrated here, the gantry structure further includes a Z-axis stage for moving the laser light source and optics in a direction generally parallel to the fan-shaped beam 24 to thereby controllably vary the distance between the beam source 20 and the wafer 22 and thus control the focusing of the line beam 26 on the wafer 22. Exemplary dimensions of the line beam 26 include a length of 1 cm and a width of 66 microns with an exemplary power density of 220 kW/cm$^2$. Alternatively, the beam source and associated optics may be stationary while the wafer is supported on a stage which scans it in two dimensions.

In typical operation, the gantry beams 16, 18 are set at a particular position along the fixed rails 12, 14 and the beam source 20 is moved at a uniform speed along the gantry beams 16, 18 to scan the line beam 26 perpendicularly to its long dimension in a direction conveniently called the fast direction. The line beam 26 is thereby scanned from one side of the wafer 22 to the other to irradiate a 1 cm swath of the wafer 22. The line beam 26 is narrow enough and the scanning speed in the fast direction fast enough that a particular area of the wafer is only momentarily exposed to the optical radiation of the line beam 26 but the intensity at the peak of the line beam is enough to heat the surface region to very high temperatures. However, the deeper portions of the wafer 22 are not significantly heated and further act as a heat sink to quickly cool the surface region. Once the fast scan has been completed, the gantry beams 16, 18 are moved along the fixed rails 12, 14 to a new position such that the line beam 26 is moved along its long dimension extending along the slow axis. The fast scanning is then performed to irradiate a neighboring swath of the wafer 22. The alternating fast and slow scanning are repeated, perhaps in a serpentine path of the beam source 20, until the entire wafer 22 has been thermally processed.

The optics beam source 20 includes an array of lasers. An example is orthographically illustrated in FIGS. 2 and 3, in which laser radiation at about 810 nm is produced in an optical system 30 from two laser bar stacks 32, one of which is illustrated in end plan view in FIG. 4. Each laser bar stack 32 includes 14 parallel bars 34, generally corresponding to a vertical p-n junction in a GaAs semiconductor structure, extending laterally about 1 cm and separated by about 0.9 mm. Typically, water cooling layers are disposed between the bars 34. In each bar 34 are formed 49 emitters 36, each constituting a separate GaAs laser emitting respective beams having different divergence angles in orthogonal directions. The illustrated bars 34 are positioned with their long dimension extending over multiple emitters 36 and aligned along the slow axis and their short dimension corresponding to the less than 1-micron p-n depletion layer aligned along the fast axis. The small source size along the fast axis allows effective collimation of the fast axis. The divergence angle is large for the fast axis and relatively small for the slow axis.

Figure 2:
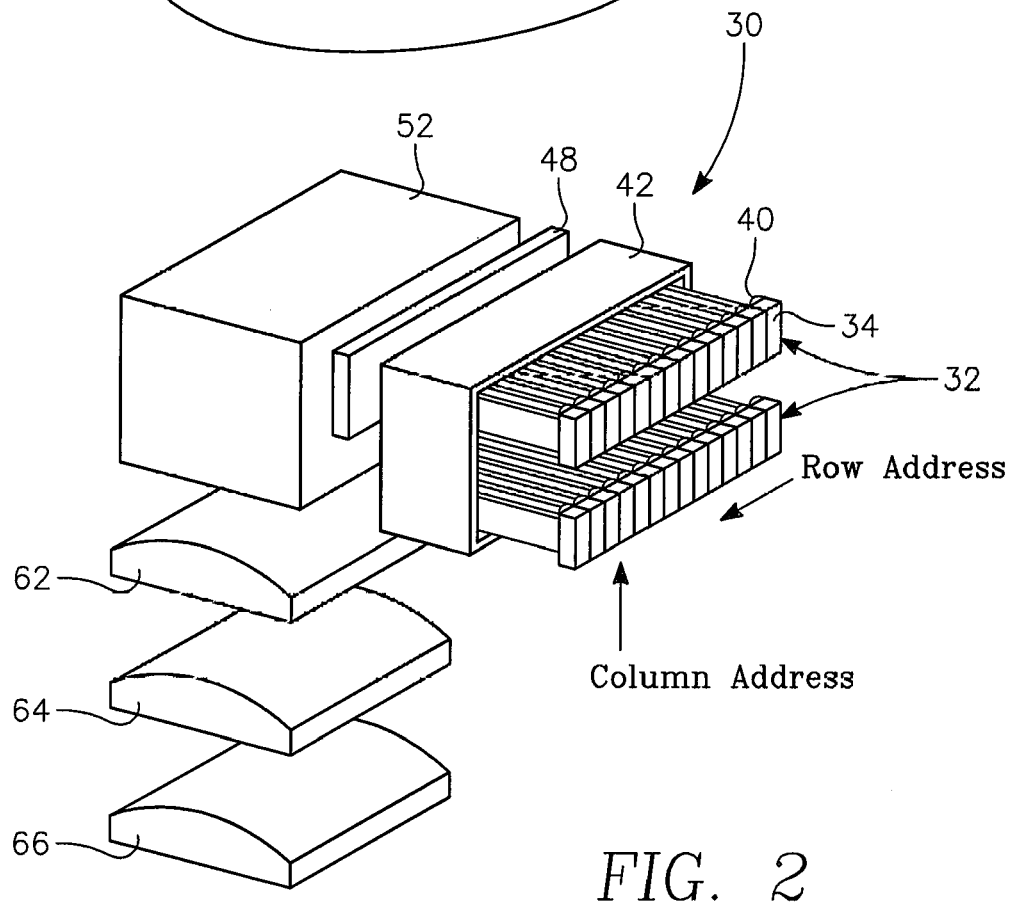
FIGS. 2 and 3 are orthographic views from different perspectives of optical components of the apparatus of FIG. 1.
Figure 3:
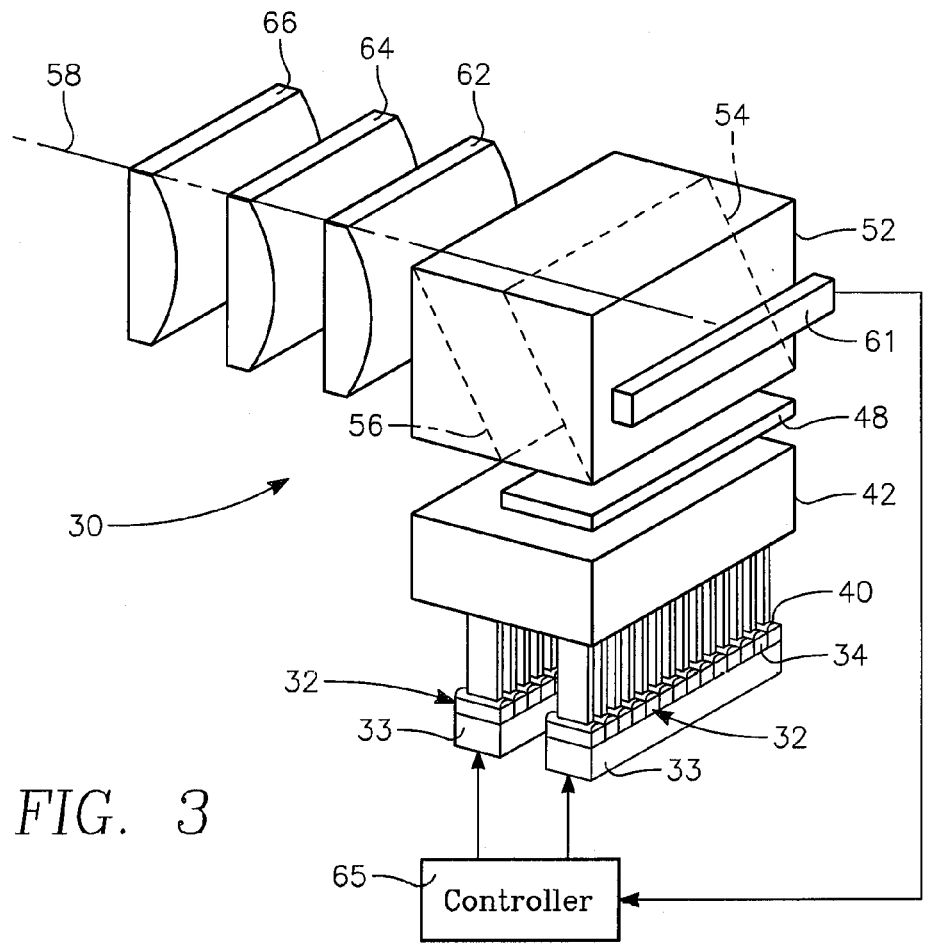
Figure 4:
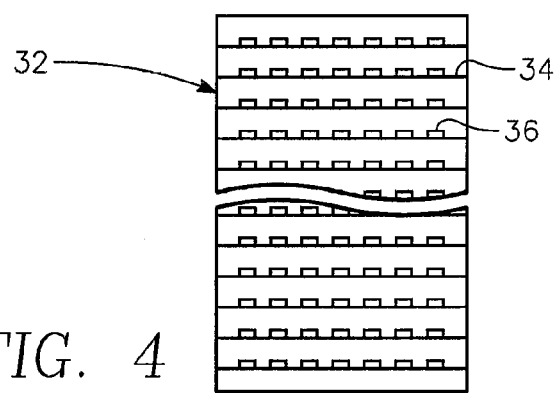
FIG. 4 is an end plan view of a portion of a semiconductor laser array in the apparatus of FIG. 1.

Referring to FIGS. 2, 3 and 4, two arrays of cylindrical lenslets 40 are positioned along the laser bars 34 to collimate the laser light in a narrow beam along the fast axis. They may be bonded with adhesive on the laser stacks 32 and aligned with the bars 34 to extend over the emitting areas 36.

The optics beam source 20 can further include conventional optical elements to collect and focus the light from all the laser bars 32 into a single thin line beam on the wafer surface. Such conventional optical elements can include an interleaver and a polarization multiplexer, although the selection by the skilled worker of such elements is not limited to such an example. In the example of FIGS. 2 and 3, the two sets of beams from the two bar stacks 32 are input to an interleaver 42, which has a multiple beam splitter type of structure and having specified coatings on two internal diagonal faces, e.g., reflective parallel bands, to selectively reflect and transmit light. Such interleavers are commercially available from Research Electro Optics (REO). In the interleaver 42, patterned metallic reflector bands are formed in angled surfaces for each set of beams from the two bar stacks 32 such that beams from bars 34 on one side of the stack 32 are alternatively reflected or transmitted and thereby interleaved with beams from bars 34 on the other side of the stack 32 which undergo corresponding selective transmission/reflection, thereby filling in the otherwise spaced radiation profile from the separated emitters 36.

A first set of interleaved beams is passed through a quarter-wave plate 48 to rotate its polarization relative to that of the second set of interleaved beams. Both sets of interleaved beams are input to a polarization multiplexer (PMUX) 52 having a structure of a double polarization beam splitter. Such a PMUX is commercially available from Research Electro Optics. First and second diagonal interface layers 54, 56 cause the two sets of interleaved beams to be reflected along a common axis from their front faces. The first interface 54 is typically implemented as a dielectric interference filter designed as a hard reflector (HR) while the second interface 56 is implemented as a dielectric interference filter designed as a polarization beam splitter (PBS) at the laser wavelength. As a result, the first set of interleaved beams reflected from the first interface layer 54 strikes the back of the second interface layer 56. Because of the polarization rotation introduced by the quarter-wave plate 48, the first set of interleaved beams passes through the second interface layer 56. The intensity of a source beam 58 output by the PMUX 52 is doubled from that of the either of the two sets of interleaved beams.

Although shown as being separated in the drawings, the interleaver 42, the quarter-wave plate 48, and the PMUX 52 and its interfaces 54, 56, as well as additional filters that may be attached to input and output faces are typically joined together by a plastic encapsulant, such as a UV curable epoxy, to provide a rigid optical system. The lenslets 40 are bonded by plastic bonding to the laser stacks 32, on which they are aligned to the bars 34. The source beam 58 is passed through a set of cylindrical lenses 62, 64, 66 to focus the source beam 58 along the slow axis.

Figure 6:
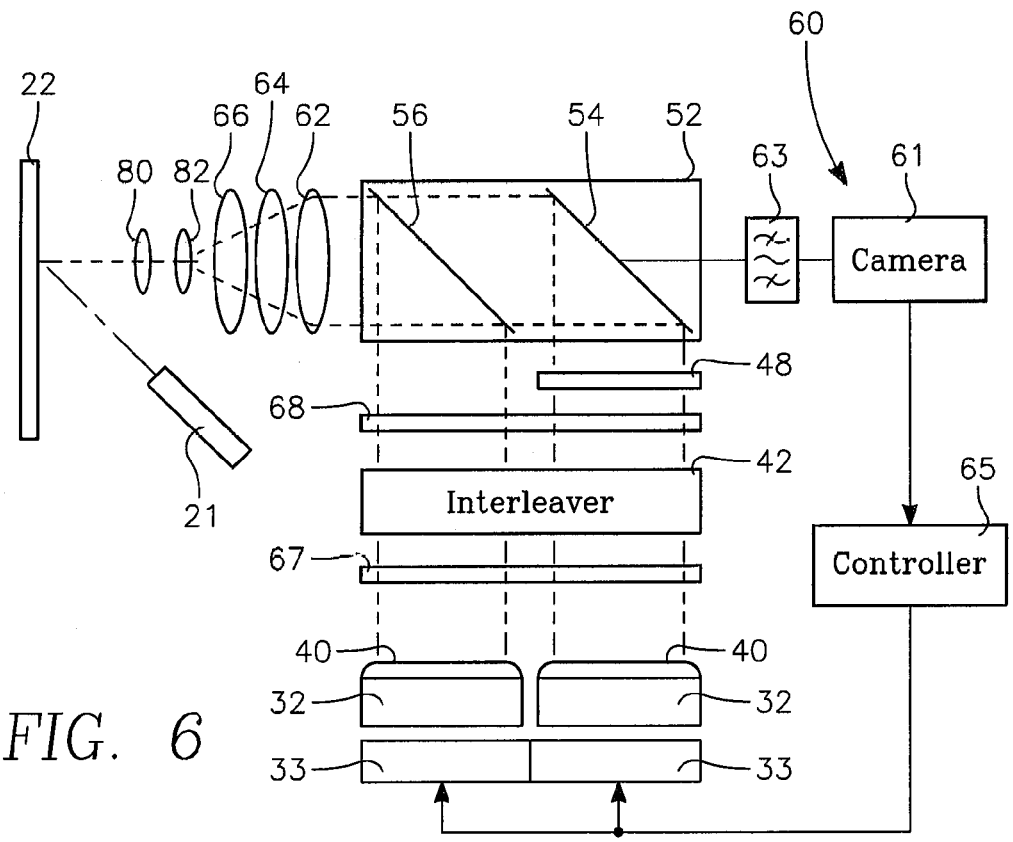
FIG. 6 is a schematic diagram of a system including the features of FIGS. 2-4 in accordance with a preferred embodiment.

As further illustrated in the schematic view of FIG. 6, further anamorphic lens set or optics 80, 82 expands the output beam in the slow axis and includes a generally spherical lens to project the desired line beam 26 on the wafer 22. The anamorphic optics 80, 82 shape the source beam in two dimensions to produce a narrow line beam of limited length.

Pyrometry:

One aspect of the invention uses the same optics used to focus the laser source light on the wafer to direct thermal radiation emitted from the neighborhood of the line beam 26 on the wafer 22 in the reverse direction to a pyrometer 60, schematically illustrated in FIG. 6, including an optical detector 61, such as a photodiode, and an optical filter 63 blocking the wavelength, e.g., 810 nm, of the laser radiation. The pyrometer filter 63 preferably is a narrow passband filter covering a region of the thermal radiation curve which is quickly changing at the temperatures of interest. A preferred pyrometer passband is centered at 1550 nm (in which case the detector 61 may be an InGaAs photodiode). As one of many alternatives, the pyrometer passband may be centered at 950 nm (in which case the detector 61 may be a Si photodiode). The passband may extend over a few tens of nm for the shorter wavelength and perhaps 100 nm at the longer wavelength. The optics are generally reciprocal and thus in the reverse direction detect only a small area of the wafer 22 on or very near to the line beam 26 and optically expands that image to an area generally having a size of the emission face of the bar stacks. Typically narrow band interference filters 63 are used having a passband near 1550 nm or 950 nm which block the laser wavelength at 810 nm by several orders of magnitude and substantially block the laser spontaneous emission not coincident with the pyrometer wavelength. The two PMUX interfaces 54, 56 are designed to pass the pyrometer wavelength irrespective of its polarization. Such a function can be implemented with interference mirrors tuned to the 810 nm source radiation and not the pyrometer wavelength. The more conventional interfaces 54, 56 are designed such that the first interface 54 is a hard-reflector (HR) interference filter but the second interface 56 is a polarization beam splitter (PBS) tuned to 810 nm or other laser wavelength. The interference filter at the PBS interface 56 may be detuned to the extent that it passes a substantial portion (e.g. 72%) of a first polarization at the pyrometer wavelength while reflecting the first polarization of the laser light (or at least most of it). Likewise, the interference filter in the HR interface 54 is redesigned such that it passes a large fraction (e.g., 90%) of the first polarization at the pyrometer wavelength while reflecting most of the other polarization of both wavelengths. As a result of the filtering of both the PMUX interfaces 54, 56 and the narrow band pyrometer filter 63, the photodetector 61 receives only the narrow-band optical signal in a portion of the thermal (blackbody radiation) spectrum. Thus, an optical filter or path that blocks or admits a particular wavelength is sufficient even though it does not completely block or completely admit all of the light at that wavelength.

The output of the photodetector 61 is supplied to a source controller 65, which converts the detected photocurrent to a wafer temperature and compares it to a desired temperature and thereby adjusts the power supplied to the laser bars 32 to increase or decrease their optical output in the direction of the desired wafer temperature.

A difficulty with this approach is that the GaAs or other semiconductor lasers either emit or induce a fairly wide spectrum of low-level pit-of-band emission that typically overlaps the pyrometer wavelength. As a result of the out-of-band emission, which the pyrometer filter 63 does not block at the pyrometer wavelength, the photodetector 61 would detect both: (a) the wafer thermal radiation at the pyrometer wavelength and (b) the portion of the out-of-band emission at the pyrometer wavelength, in the absence of additional filtering. This difficulty is avoided in large part by filtering out the out-of-band emission at the pyrometer wavelength with a notch filter 67 placed between the lens array 40 and the interleaver 42 or a notch filter 68 placed between the interleaver 42 and the PMUX 52. The notch filter 67 or 68 blocks the out-of-band radiation at the pyrometer wavelength, specifically whatever wavelengths are passed by the pyrometer filter 63, e.g. 1550 nm or 950 nm, and pass at least the laser radiation at 810 nm. The ratio of the transmission coefficient of the laser wavelength to that of pyrometer wavelength should be several orders of magnitude. A minimum requirement of the notch filters 67, 68 is that they block wavelengths longer than the laser wavelength, e.g., 810 nm, although radiation at shorter wavelengths do not inherently degrade the pyrometer. The notch filters 67, 68 may be easily implemented as interference filters coated on either the interleaver 42 or the PMUX 52, although they may be implemented as stand alone filters. Examples are described in U.S. Publication No. 2006/0102607, May 18, 2006 entitled MULTIPLE BAND PASS FILTERING FOR PYROMETRY IN LASER BASED ANNEALING SYSTEMS by Bruce Adams, et al. and assigned to the present assignee, and particularly at FIGS. 7-9 of the cited patent application.

The anamorphic optics between the optical source and the water typically include anti-reflection coatings. With the invention, the anti-reflection and other coatings need to be designed not only for the laser wavelength but also for the pyrometer wavelength.

As an alternative, the wavelength filtering performed by the PMUX interfaces can be replaced by selective transmission at the laser wavelength and selective reflection at the pyrometer wavelength. It may be possible to carry out the invention without either the interleaver 42 or the polarization multiplexer 52 or without both of them. As one possible example, an optical element similar to the reflective surfaces 54, 56 (or similar to one of them) may be employed to carry out the invention, that element not being part of a polarization multiplexer.

Figures 5A, 5B:
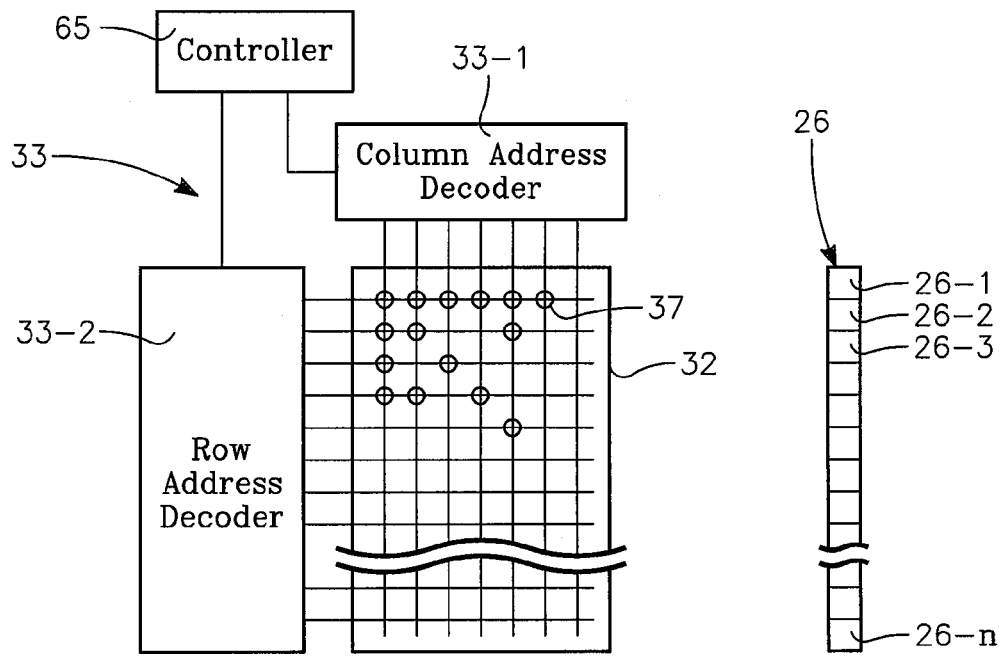
FIG. 5A is a view back side of the laser array of FIG. 4 and depicts row and column addressing of the laser array.
FIG. 5B depicts the individual image elements along the line beam 26 of FIG. 1 corresponding to individual columns of emitter in the laser stack of FIGS. 4 and 5A.

Compensation for Non-Uniformities in Wafer Surface Temperature Using an Addressable Laser Array:

FIG. 3 indicates that the controller 65 interfaces with the lasers stacks 32 through a row-column address decoder 33. This feature enables the controller to govern the output levels of individual laser emitter 36 independently. FIG. 5A depicts an embodiment of the back side of the laser stack or array 32 of FIG. 4, in which each laser emitter 36 depicted in FIG. 4 controlled by an individual emitter logic circuit 37. The laser emitters 36 of the laser stack of the array 32 are arranged in rows (bars 34) and columns. FIG. 5A shows that the row-column address decoder 33 consists of a column address decoder 33-1 and a row address decoder 33-2, which together enable the controller 65 to access an individual emitter 36 through its emitter logic circuit 37 based upon its row and column position within the array 32.

Figure 7:
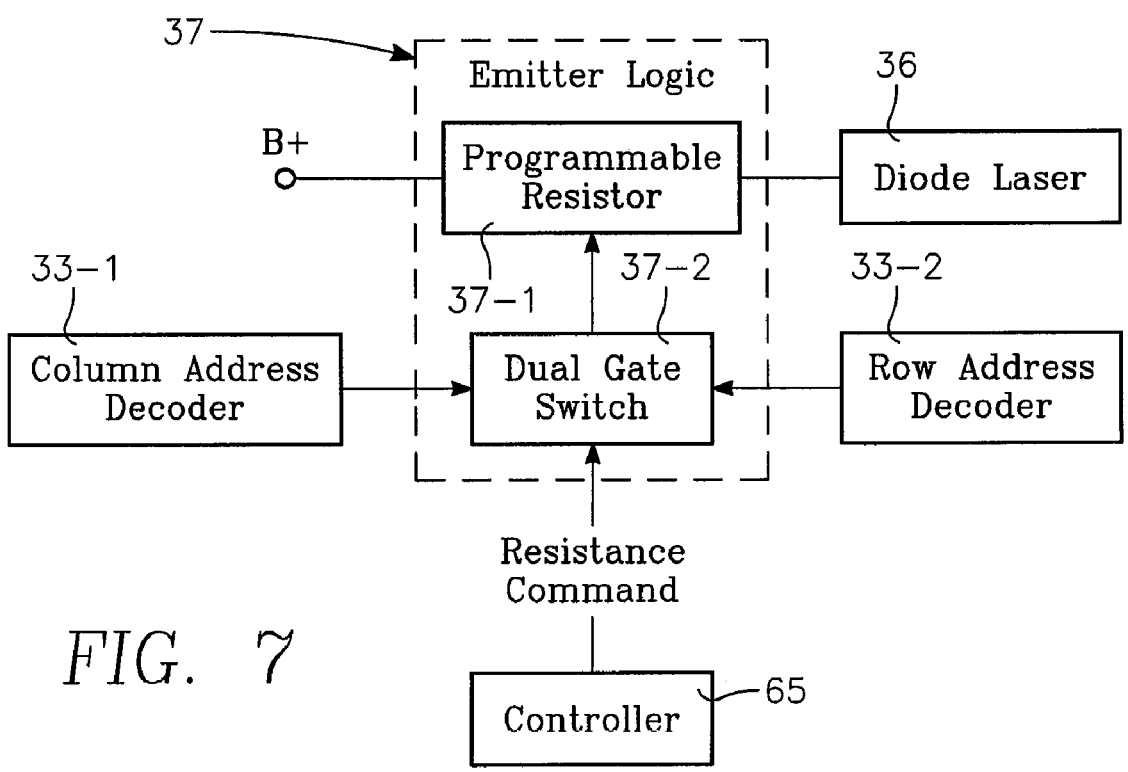
FIG. 7 depicts the row and column addressing of a typical individual emitter logic associated with an individual laser emitter of the addressable array of laser emitters of FIG. 5A.

Referring to FIG. 7, in one implementation the emitter logic circuit 37 has a programmable resistor 37-1 through which supply current flows to the individual laser diode (emitter 36). The emitter logic circuit also has a dual gate switch 37-2 through which a resistance-changing command is gated from the controller 65 to the programmable resistor 37-1. The two gates of the switch 37-2 are coupled to corresponding column and row outputs of the address decoders 33-1, 33-2. The switch 37-2 permits a resistance-changing signal from the controller 65 to reach the programmable resistor 37-1 whenever both the column and row address decoders 33-1, 33-2 enable the corresponding row and column. The programmable resistor 37-1 may be a field effect transistor with a floating gate device, in which case the resistance-changing signal from the controller 65 is one which either charges or discharges the floating gate depending upon whether the resistance is to be increased or decreased. Other implementations may be employed. By thus changing the resistance of the programmable resistor 37-1, the controller 65 separately controls the supply current to each individual diode laser, and thus independently controls the optical power output of each emitter 36.

Each column of emitters 36 in the array 32 is focused by the optics on an individual one of sections or image elements 26-1 through 26-n of the line beam 26 depicted in FIG. 5R. The width of each of the n beam sections or image elements corresponds approximately to the minimum resolvable spot size of the focused line beam. The controller 65 can vary the beam intensity at a particular one of the line beam sections or image elements 26-1 through 26-n by varying the supply current to the laser diodes in the corresponding column. For example, the controller 65 could increase or decrease the supply current to some or all of the laser diodes in the selected column.

The detector 61 is preferably a CCD camera that captures the image of the entire line beam 26 with each image sample and has sufficient resolution to sense the irradiance at each individual image element 26-1 through 26-n. The output of the camera 61 is used in the manner of pyrometry to compute the temperature at each of the n image elements 26-1 through 26-n on the wafer surface. From this, the wafer surface temperature distribution along the line beam 26 is constructed by the controller 65. The controller 65 deduces from this distribution how to change the distribution of laser diode supply currents to different columns of lasers so as to minimize or eliminate deviations in the temperature distribution.

Figure 8:
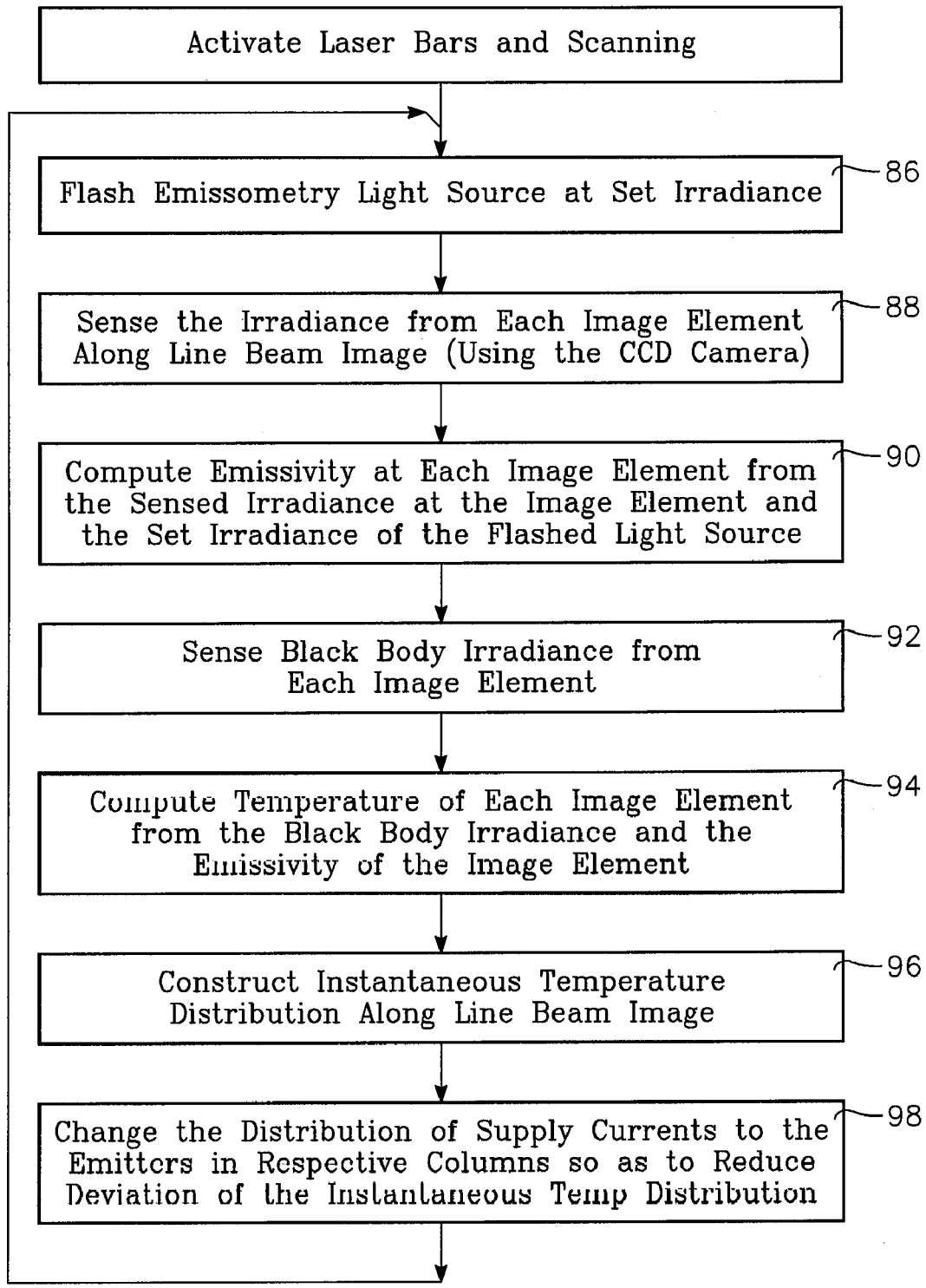
FIG. 8 depicts a process performed by the controller of the DSA apparatus of FIGS. 3 and 6 for producing a more uniform wafer surface temperature distribution across wafer surface zone illuminated by the scanning laser line beam of FIG. 1.

The process is depicted in FIG. 8. In order to employ pyrometry computations to compute the wafer surface temperature at each image element, emissivity is measured first. This is accomplished by flashing an emissometry light source 21 (FIG. 1) of a measured irradiance onto the zone of the wafer surface currently illuminated by the laser line beam 26 (block 86 of FIG. 8). The CCD camera 61 samples and stores the image of the ambient background radiation from the wafer prior to the flashing of the emissometry light source. Then, during the instant in which the emissometry light source is flashed, the CCD camera 61 subtracts the previously sampled background radiation from the current image, so that the output of the CCD camera 61 is an accurate measurement of the emissometry source light reflected from each image element 26-1 through 26-n on the wafer surface. During that instant, the controller 65 captures the reflected light intensity for each individual image element 26-1 through 26-n (block 88 of FIG. 8) and computes n corresponding emissivities given the brightness of the emissometry light source (block 90 of FIG. 8). After the emissivity light source 21 has flashed and is not radiating, the controller 65 samples the thermal radiation from each image element 26-1 through 26-n measured by the camera 61 (block 92 of FIG. 8). The controller 65 combines the computed emissivity of each individual image element 26-1 through 26-n on the wafer surface with the thermal radiance sensed from that image element by the camera 61 to compute the wafer surface temperature at the corresponding image element (block 94 of FIG. 8). This computation produces n wafer surface temperatures corresponding to the n image elements illuminated by the line beam 26. The controller 65 then constructs the distribution of the n temperature measurements and determines which image elements are either above or below the desired wafer surface temperature value or limited range (block 96 of FIG. 8). The controller changes the distribution of supply currents among the different columns of emitters 36 so as to reduce the deviation in the temperature distribution (block 98 of FIG. 8). For example, the controller 65 reduces the supply current to those columns of emitters 36 corresponding to an image element associated with a surface temperature above the desired value or range. Likewise the controller increases the supply current to those columns of emitters 36 corresponding to an image element associated with a surface temperature below the desired value or range.

Figure 9A:
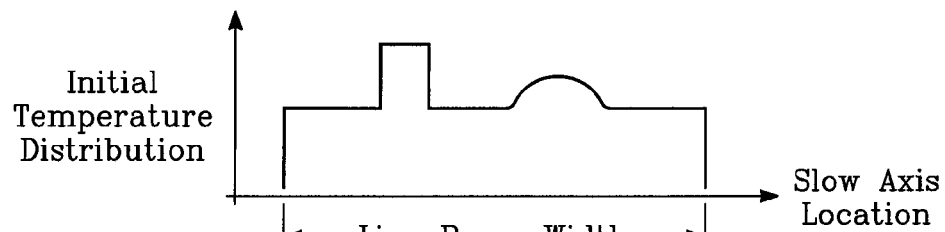
FIG. 9A is a graph depicting an example of an uncorrected temperature distribution.
Figure 9B:
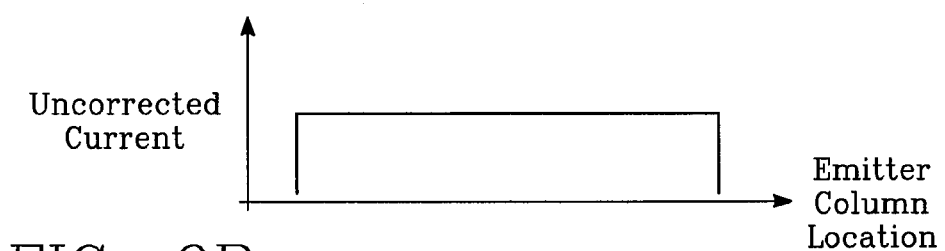
FIG. 9B is a graph of the supply current distribution across the columns of the laser array corresponding to the temperature distribution of FIG. 9A.
Figure 9C:
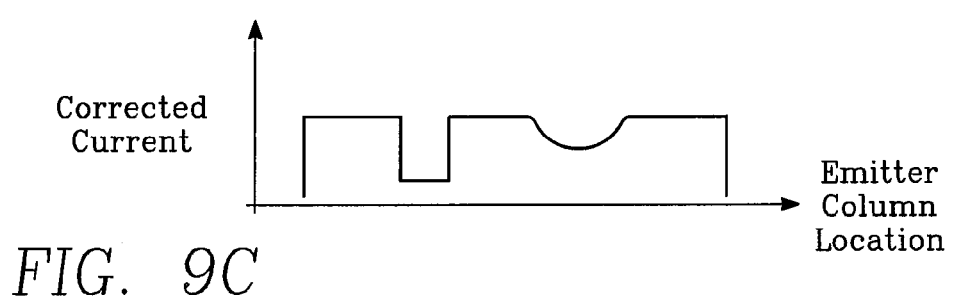
FIG. 9C is a graph of the supply current distribution across the columns of the laser array that has been corrected in accordance with deviations in the temperature distribution of FIG. 9A.
Figure 9D:
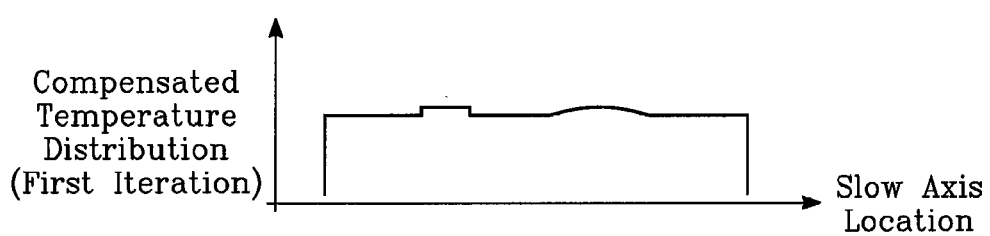
FIG. 9D is a graph depicting the compensated temperature distribution produced by the corrected supply current distribution of FIG. 9C.

A simplified example of this process is depicted in FIGS. 9A through 9D. In FIG. 9A, an initial temperature distribution reveals several zones along the line beam 26 that are above a uniform level. This distribution was produced by an uncorrected distribution of supply currents to all the laser columns, which was therefore uniform as indicated in FIG. 9B. The supply current distribution among the columns of laser emitters is then corrected so as to compensate for the non uniformities in the temperature distribution of FIG. 9A, the corrected supply current distribution being depicted in FIG. 9C and appearing to have variations similar to an inverse of the initial temperature distribution of FIG. 9A. The resulting "corrected" temperature distribution is depicted in FIG. 9D, in which the non-uniformities apparent in FIG. 9A have been nearly eliminated.

Figure 10:
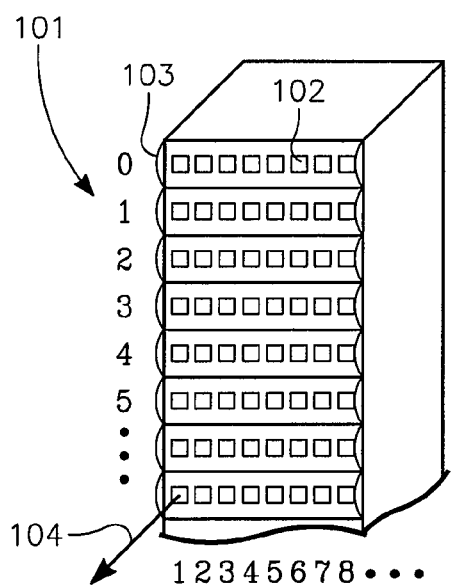
FIG. 10 depicts a row-column addressable laser array that can be employed in carrying out the invention.

FIG. 10 illustrates a row/column addressable laser diode stack 101 constructed in accordance with U.S. Pat. No. 6,728,275. The row of the stack 101 consists of an individual laser diode bar comprised of individual emitters 102. The emitters 102 of the stack 101 are aligned in columns. The columns may vary in number and this number is dependent upon the number of emitters 102 within each laser diode bar. The number of rows is determined by the number of laser diode bars in the laser diode stack 101. The laser output radiation or beam 104 is made substantially plane wave in propagation with the use of attached microlenses 103. One or more emitters 102 are electrically connected in parallel within a laser diode bar and in parallel with emitters of adjacent laser diode bars. There are many possible electrical wiring configurations. One example is for the emitters 102 located in each particular column (e.g., column 0) to be electrically common so that they operate in unison and emit laser beams 104 simultaneously. This approach is taught in U.S. Pat. No. 6,728,275.

Figure 13:
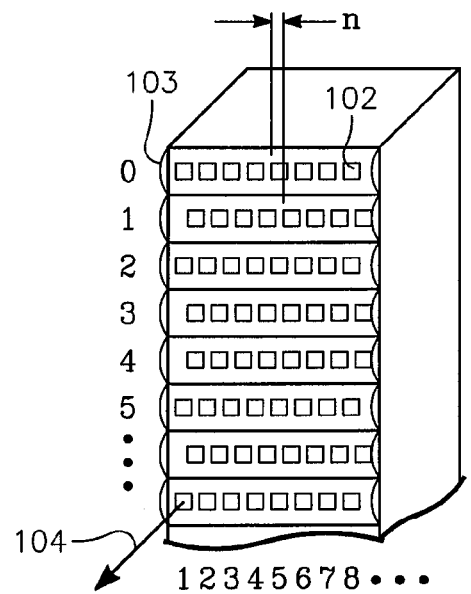
FIG. 13 illustrates an alternative mode of the laser array of FIG. 10 in which successive rows of laser emitters are offset from one another.
Figure 14:
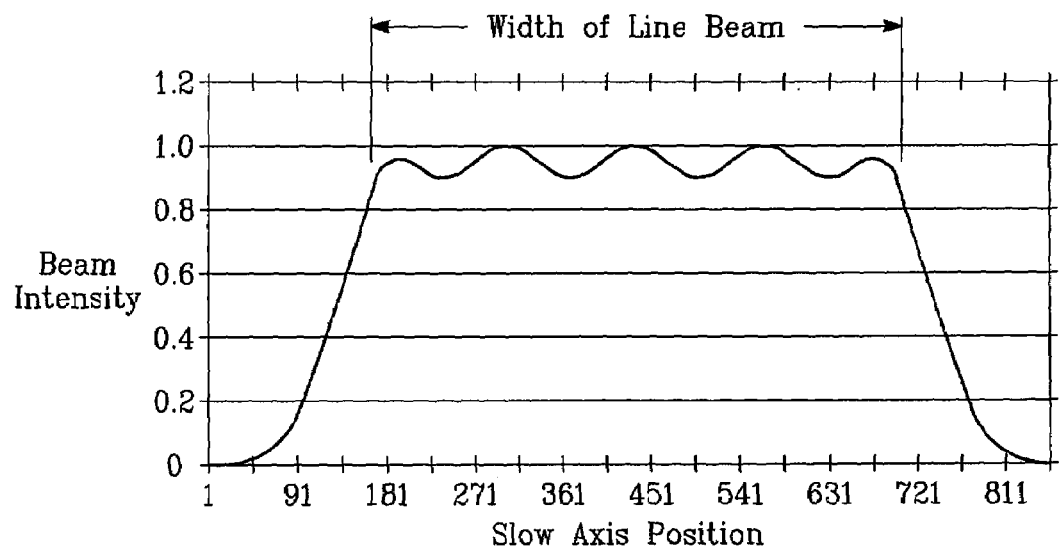
FIG. 14 is a graph depicting the spatial distribution of optical radiation from the laser stack of FIG. 13 in a first operational mode.
Figure 15:
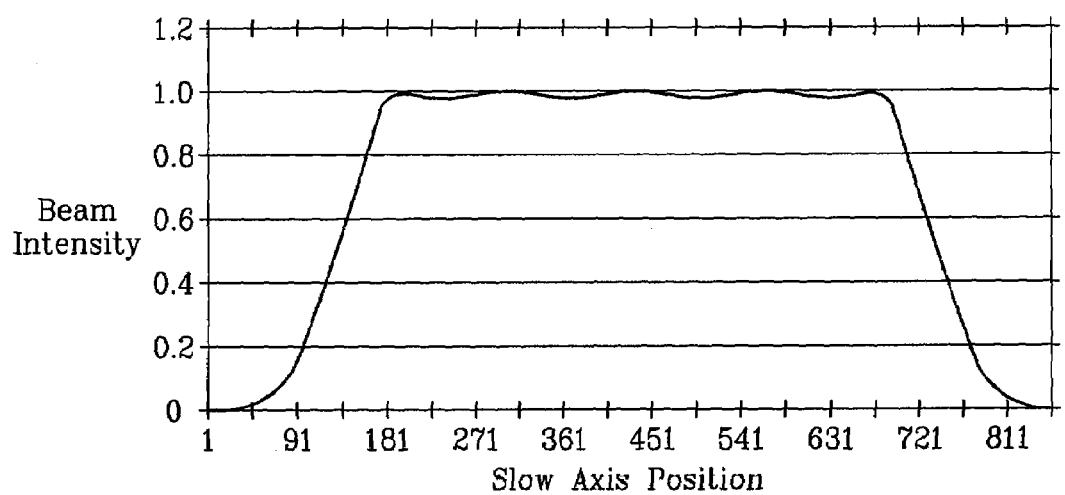
FIG. 15 is a graph depicting the spatial distribution of optical radiation from the laser stack of FIG. 13 in a second operational mode.

An alternative mode of U.S. Pat. No. 6,728,275 is to offset adjacent rows of the emitters 102 so that neighboring rows of emitters 102 are displaced by a distance "n" in the manner depicted in FIG. 13, where n may be a fraction of or equivalent to the distance between emitters 102 in the column direction. In this case, if only the emitters 102 of alternate rows (for example, the even numbered rows) are electrically powered, the spatial distribution of the optical radiation of the laser diode stack 101 may appear as shown in FIG. 14 after passing through a lens system that superimposes all rows with a magnification such that the laser beams 104 from individual emitters will overlap at the full width half maximums of each emitter beam distribution. Now, if the remaining rows (the odd numbered rows) are electrically powered, the more uniform radiation distribution shown in FIG. 15 can be realized by properly adjusting the individual supply current levels delivered to the individual columns of emitters 102. Such a uniform and flat distribution of radiation or energy may be useful to compensate for variations in light output within the laser diode stack 101, system optics, or variations in reflectivity or absorption on the substrate. Further, modifications to the radiation distribution of the laser stack 101 can be made to have non-uniformities that perfectly compensate for non-uniformities of reflectivity and absorption on the surface of the substrate. Such modifications to the laser stack output radiation distribution may be accomplished with a computer controlled system utilizing appropriate sensors to measure reflectivity and absorption variations and to electrically vary the output of individual columns of lasers in the stack 101, so that these variations are compensated for in nearly real time.

Figure 11:
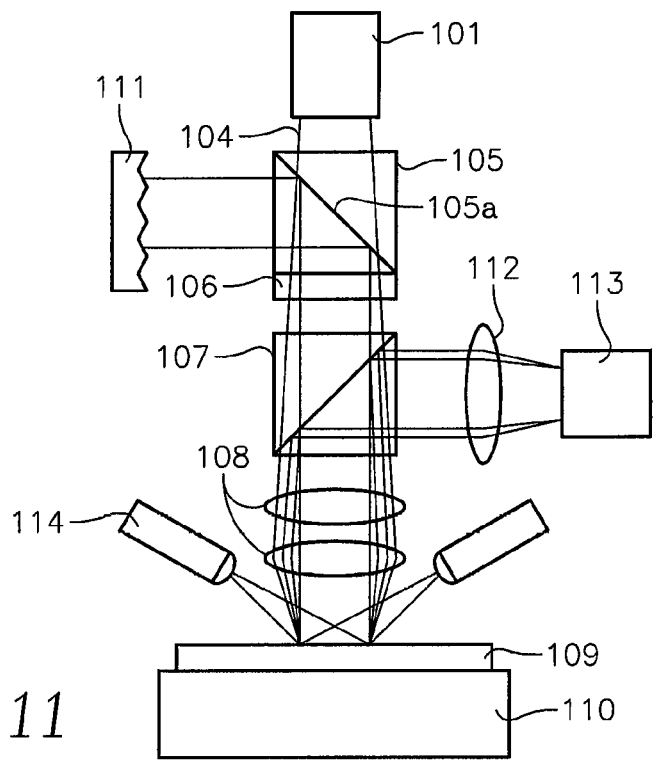
FIG. 11 is a schematic diagram of a dynamic surface anneal system in one aspect of the invention employing the laser array of FIG. 10.

An implementation of a DSA system employing the laser diode stack 101 is shown in FIG. 11. The linearly polarized laser output radiation or beam 104 of the laser diode stack 101 enters a polarizing beam splitting cube 105 in which the hypotenuse 105a is coated to efficiently transmit the laser light. The linearly polarized laser light then enters a one quarter wave phase retardation plate 106 and becomes circularly polarized. The laser light next enters a beam splitting cube 107 where it is transmitted to reduction optics 108. The reduction optics 108 forces the beams of all rows of emitters to be superimposed at a focus position located slightly above, at, or slightly below the surface of the substrate 109. A portion of the laser light is reflected by the substrate 109 and as a result of reflection becomes circularly polarized in the opposite direction. This oppositely circularly polarized light enters the reduction optics 108, the beam splitting cube 107, and then the one quarter wave phase retardation plate 106 where it becomes linearly polarized again but with the e-field of the laser light rotated ninety degrees from the first pass. The 90 degree rotated linearly polarized light then impinges upon the hypotenuse 105a of the polarizing beam splitting cube 105 where it is mostly reflected and finally mostly absorbed by an absorbing surface 111 which may be fluid cooled. In this manner the laser diode stack 101 is protected from energy which is reflected from the substrate 109 which may otherwise cause undesirable thermal heating and or damage to the laser diode stack 101 or its components, or undesirable optical performance such as laser feedback to the laser cavities within the emitters 102.

Thermal radiation is emitted by the substrate 109 as a result of heat created by the impinging laser light. A portion of the thermal radiation is collected by the reduction optics 108 and reflected by the beam splitting cube 107 where it enters pyrometry and emissometry imaging optics 112. A camera 113 produces an image of the thermal radiation at the substrate 109 at each image element corresponding to a zone of the substrate surface illuminated by a particular column of emitters 104 of the stack 101. For accurate calculation of the temperature of the substrate 109, the emissivity of the substrate 109 is first obtained. Emissometry light source 114 is flashed to illuminate the substrate 109, and this flashed radiation is partially reflected into the reduction optics 108, beam splitting cube 107, and imaged by the pyrometry and emissometry imaging optics 112 on to the camera 113. When the emissometry light source 114 is flashed or powered, the output of the camera 113 will be essentially only comprised of the emittance of the substrate 109, because the CCD camera 113 subtracts out the background radiation in the same manner as described above with reference to the CCD camera 61 in the process of FIG. 8. In this way, the system is able to measure the emittance of the substrate 109 and calculate the temperature at discrete points (i.e., the image elements on the wafer surface illuminated by discrete columns of the emitters 104 of the stack 101) based upon the emittance at those discrete points. The computation of emittance and hence temperature from the radiation sensed by the CCD camera 113 is carried out in accordance with well-understood principles. The system of measuring discrete points for emittance and thermal radiation is referred to in this embodiment as "imaging emissometry and pyrometry."

There is benefit in performing this thermal process at elevated temperatures prior to illumination with the laser energy. A heated electrostatic chuck (ESC) 110 heats the substrate 109 to a user-selected temperature to reduce the amount of laser energy required for processing and reduce thermal strain gradients within the substrate 109.

Figure 12:
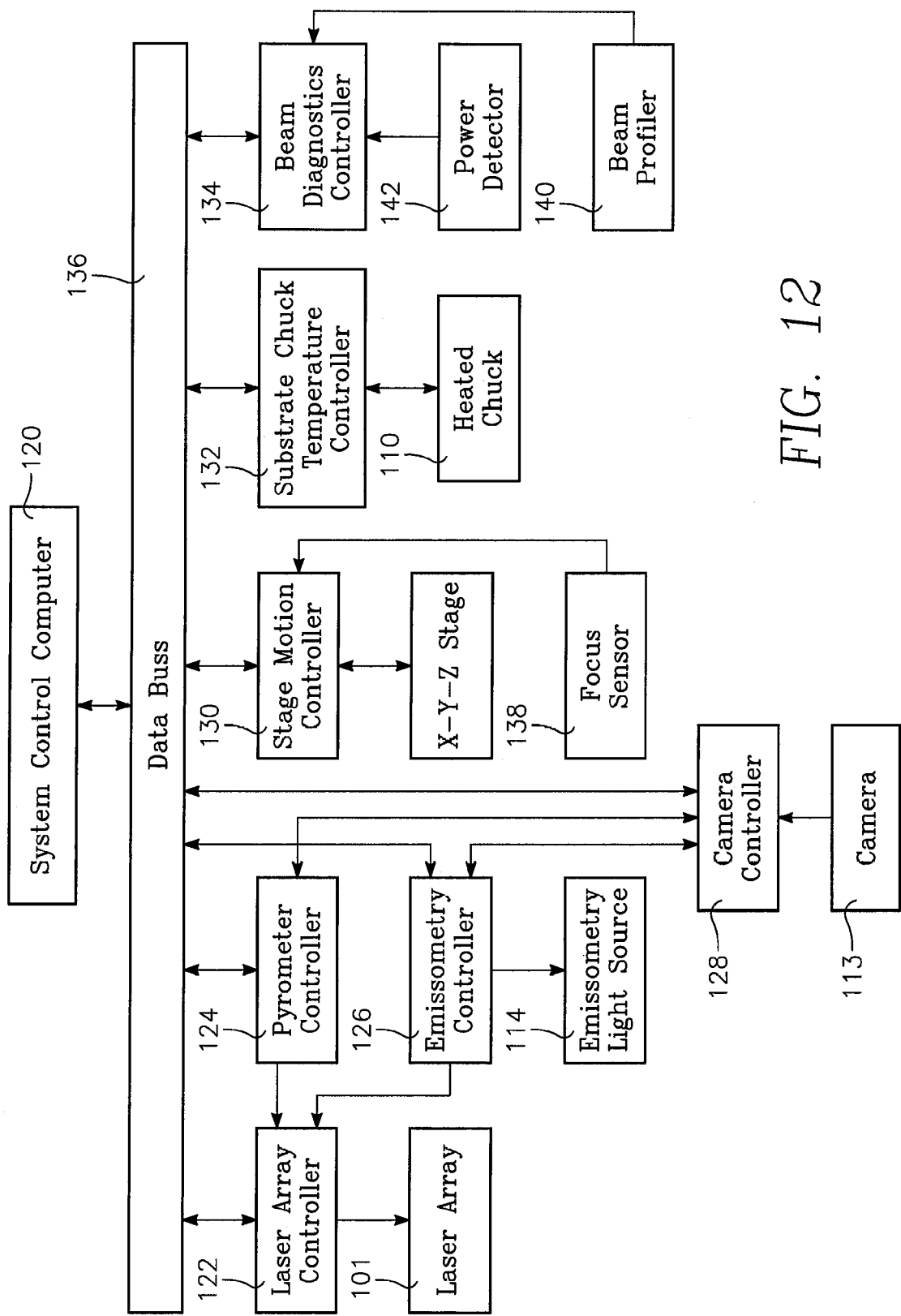
FIG. 12 is a schematic diagram of a system for controlling the apparatus of FIG. 11.

FIG. 12 illustrates a block diagram of a DSA system controlling the DSA apparatus of FIG. 11. In FIG. 12, a system control computer 120 communicates with laser array, pyrometry, emissometry, camera, stage motion, electrostatic chuck temperature and beam diagnostics controllers 122, 124, 126, 128, 130, 132, 134, respectively, over a data buss 136. Alternately, the system control computer may communicate directly with the controllers 122, 124, 126, 128, 130, 132, 134. During operation, the wafer or substrate 109 is loaded onto the heated ESC 110. An alignment system (not shown) may be used to find fiducials on the substrate 109 and align the patterns (if any) with locations expected to be encountered based on information stored in memory of the system control computer 120. The information may be useful for passively or dynamically controlling the output of the laser diode array 101. The system control computer 120 confirms that the substrate ESC temperature controller 132 senses that the ESC 110 has reached the correct temperature and then commands the stage motion controller 130 to move the ESC 110/substrate 109 to the starting position. The X Y Z stage (FIG. 1) is set into motion and the output power level of the laser array 101 is increased, while a focus sensor 138 not illustrated in FIG. 11 simultaneously provides feedback to the stage motion controller 130 to enable the stage motion controller 130 to z-position the substrate 109 to the user-selected focus position. Additionally, and simultaneously, the emissometer light source 114 is flashed to allow the emmissometry controller 126 to begin calculating the emmittance from each image element of the substrate 109. The pyrometry controller 124 calculates the temperature distribution along the laser-illuminated zone of the surface of the substrate 109. The output of the pyrometry and emissometry controllers 124, 126 may be read by the system control computer 120 to create a map of the wafer and or to command the laser array controller 122 to send different electrical current level to appropriate columns within the laser diode stack 101 to produce the desired (or user selectable) temperature uniformity in the illuminated zone of the substrate surface. Alternatively, the emissometry and pyrometry controllers 126, 124 can provide direct feedback to the laser array controller 122 to control the temperature distribution across the laser-illuminated zone of the substrate surface. Beam profiler and power detector sensors 140, 142 not illustrated in FIG. 11 provide the beam diagnostics controller 134 with inputs for determining power as a function of current and voltage, spot size, spot profile, depth of focus, field curvature, and power level for each column of the laser diode stack 101.

The substrate 109 may be moved in a plane, in the x-y directions, to process smaller sections of the substrate 109 until the entire substrate 109 has been processed. Alternatively, the substrate 109 may be moved in one direction (for example the x direction) and the laser and optical system shown in FIG. 11 moved in the orthogonal direction (y direction). Additionally, the substrate 109 may be fixed and the laser and optical system shown in FIG. 11 may be moved in the x-y-z directions to sweep across the Substrate (9) and thermally process it.

While the invention has been described in detail by specific reference to preferred embodiments, it is understood that variations and modifications thereof may be made without departing from the true spirit and scope of the invention.

What is claimed is:

1. Apparatus for thermal processing a workpiece, comprising:
    a source of laser radiation emitting at a laser wavelength and comprising an array of lasers arranged in rows and columns, the optical power of each said laser being individual adjustable;
    optics for focusing the radiation from said array of lasers into a narrow line beam in a workpiece plane corresponding to a workpiece surface, whereby said optics images respective columns of said laser array onto respective sections of said narrow line beam;
    a pyrometer sensor sensitive to a pyrometer wavelength;
    an optical element in an optical path of said optics and tuned to divert radiation emanating from said workpiece plane to said pyrometry sensor, whereby said optics images each said respective section of said narrow line beam onto a corresponding portion of said pyrometer sensor; and
    a controller responsive to said pyrometry sensor and coupled to adjust individual optical outputs of respective columns of said laser array in accordance with outputs of corresponding portions of said pyrometry sensor.

2. The apparatus of claim 1 further comprising an emissivity light source of a predetermined intensity positioned to illuminate a zone of said workpiece plane that includes said narrow line beam, said emissivity light source being coupled to said controller for flash activation by said controller.

3. The apparatus of claim 1 further comprising a first optical filter in an optical path of said optics to said pyrometry sensor and tuned to admit radiation of said pyrometry wavelength and block radiation of the wavelength of said laser array.

4. The apparatus of claim 3 further comprising a second optical filter disposed in an optical path of light radiated by said laser array and tuned to block a portion of the wavelengths emitted by the laser array including said pyrometer wavelength.

5. The apparatus of claim 1, wherein said pyrometer sensor comprises a camera having a field of view corresponding to said narrow line beam.

6. The system of claim 1 further comprising:
    line beam scanning apparatus having a fast axis transverse to said line beam.

7. Apparatus for thermal processing a workpiece, comprising:
    a source of laser radiation emitting at a laser wavelength and comprising an array of lasers arranged in rows and columns, the optical power of at least each column of said laser array being individual adjustable;
    a pyrometer sensor sensitive to a pyrometer wavelength;
    common optics projecting in a first direction therethrough a line beam of said laser radiation onto a workpiece plane and directing in an opposed second direction therethrough thermal radiation from said workpiece to said pyrometry sensor as a pyrometry image corresponding to said line beam; and
    a controller responsive to said pyrometry sensor and coupled to adjust individual optical outputs of respective columns of said laser array in accordance with corresponding portions of said pyrometry image.

8. The apparatus of claim 7 further comprising an emissivity light source of a predetermined intensity positioned to illuminate a zone of said workpiece plane that includes said narrow line beam, said emissivity light source being coupled to said controller for flash activation by said controller.

9. The apparatus of claim 7 further comprising a first optical filter in an optical path of said common optics to said pyrometry sensor and tuned to admit radiation of said pyrometry wavelength and block radiation of the wavelength of said laser array.

10. The apparatus of claim 9 further comprising a second optical filter disposed in an optical path of light radiated by said laser array and tuned to block a portion of the wavelengths emitted by the laser array including said pyrometer wavelength.

11. The apparatus of claim 7, wherein said pyrometer sensor comprises a camera having a field of view corresponding to said narrow line beam.

12. The apparatus of claim 7 further comprising:
    line beam scanning apparatus having a fast axis transverse to said line beam.

* * * * *